US 9,344,066 B2

(12) United States Patent
Aremallapur

(10) Patent No.: US 9,344,066 B2
(45) Date of Patent: May 17, 2016

(54) DIGITAL OPEN LOOP DUTY CYCLE CORRECTION CIRCUIT

(71) Applicant: Texas Instruments Incorporated, Dallas, TX (US)

(72) Inventor: Nagalinga Swamy Basayya Aremallapur, Haveri (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/501,488

(22) Filed: Sep. 30, 2014

(65) Prior Publication Data

US 2016/0094205 A1    Mar. 31, 2016

(51) Int. Cl.
*H03K 3/017* (2006.01)
*H03K 5/06* (2006.01)
*H03K 7/08* (2006.01)
*G06F 1/04* (2006.01)
*H03K 5/05* (2006.01)

(52) U.S. Cl.
CPC  *H03K 3/017* (2013.01); *G06F 1/04* (2013.01); *H03K 5/05* (2013.01); *H03K 5/06* (2013.01); *H03K 7/08* (2013.01)

(58) Field of Classification Search
CPC  H03K 3/017; H03K 5/04–5/06; H03K 5/156; H03K 5/1565; H03K 7/08
See application file for complete search history.

(56) References Cited

U.S. PATENT DOCUMENTS

| | | | | |
|---|---|---|---|---|
| 6,150,847 A * | 11/2000 | Lu | ......................... | H03K 5/1565 326/93 |
| 6,285,226 B1 * | 9/2001 | Nguyen | ............. | H03K 5/00006 327/122 |
| 7,902,893 B1 * | 3/2011 | Jansson | ................ | H03K 5/1565 327/172 |
| 2010/0289538 A1 | 11/2010 | Hong et al. | | |
| 2012/0119804 A1 | 5/2012 | Ma | | |
| 2013/0063191 A1 | 3/2013 | Patil et al. | | |

OTHER PUBLICATIONS

International Search Report and Written Opinion for PCT/US2015/053362 mailed Feb. 2, 2016.

* cited by examiner

*Primary Examiner* — Patrick O'Neill
(74) *Attorney, Agent, or Firm* — John R. Pessetto; Frank D. Cimino

(57) ABSTRACT

A duty cycle correction (DCC) circuit includes a master delay line that receives an input clock and determines a period of the input clock. A calibration module is coupled to the master delay line and generates a calibration code based on a desired duty cycle and the period of the input clock. A slave delay line generates a delayed input clock based on the input clock and the calibration code. A clock generation module generates an output clock, having the desired duty cycle, in response to the input clock and the delayed input clock.

18 Claims, 4 Drawing Sheets

DIGITAL OPEN LOOP DUTY CYCLE CORRECTION CIRCUIT

TECHNICAL FIELD

Embodiments of the disclosure relate to duty cycle correction circuit in an integrated circuit.

BACKGROUND

In digital applications, it is desirable that a duty cycle of a clock is accurately controlled. A clock with 50% duty cycle has equal portion of high and low waveforms. A high insertion delay in devices results in clock pulse-width degradation. The degradation introduced in the clock by different devices on a SoC is different and hence it is challenging to meet jitter and duty cycle requirements.

Analog and digital duty cycle correction (DCC) circuits are used to maintain the duty cycle of clocks. However, these solutions have shortcomings. The performance of the analog DCC circuits is degraded because of a high start-up time since these are closed loop systems. Also, the analog DCC circuits require high power and also modify both positive and negative edges of the clock for duty cycle correction. Digital DCC circuits are limited by a high lock time since these are closed loop systems. Also, digital DCC circuits modify both positive and negative edges of the clock for duty cycle correction.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a duty cycle correction (DCC) circuit. The DCC circuit includes a master delay line that receives an input clock and determines a period of the input clock. A calibration module is coupled to the master delay line and generates a calibration code based on a desired duty cycle and the period of the input clock. A slave delay line generates a delayed input clock based on the input clock and the calibration code. A clock generation module generates an output clock, having the desired duty cycle, in response to the input clock and the delayed input clock.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
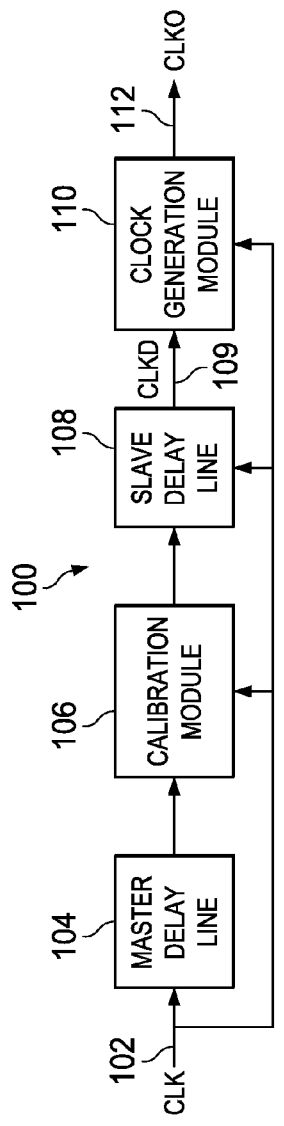
FIG. 1 is a block diagram of a duty cycle correction (DCC) circuit, according to an embodiment.

FIG. 1 illustrates a block diagram of a duty cycle correction (DCC) circuit 100, according to an embodiment. The DCC circuit 100 includes a master delay line 104, a calibration module 106, a slave delay line 108 and a clock generation module 110. Each of the master delay line 104, the calibration module 106, the slave delay line 108 and the clock generation module 110 receives an input clock CLK 102. The calibration module 106 is coupled to the master delay line 104 and the slave delay line 108 is coupled to the calibration module 106. The clock generation module 110 is coupled to the slave delay line 108 and generates an output clock CLKO 112. The DCC circuit 100 may include one or more additional components known to those skilled in the relevant art and are not discussed here for simplicity of the description.

The operation of the DCC circuit 100 illustrated in FIG. 1 is explained now. The master delay line 104 receives the input clock CLK 102 and determines a period of the input clock CLK 102. The period of the input clock CLK 102 is a time difference between two consecutive positive edges in the input clock CLK 102. In one example, the period of the input clock CLK 102 is a time difference between two consecutive negative edges in the input clock CLK 102. The master delay line 104, in one version, includes a plurality of delay elements coupled in series. Each delay element of the plurality of delay elements provides a predefined delay. A set of delay elements are activated based on the period of the input clock CLK 102.

The calibration module 106 receives the period of the input clock CLK 102 from the master delay line 104. The calibration module 106 generates a calibration code based on a desired duty cycle and the period of the input clock CLK 102. A duty cycle required to be maintained for the output clock CLKO 112 is the desired duty cycle. The desired duty cycle is programmable. In one example, the desired duty cycle is 50%. In another example, the desired duty cycle is dynamic.

The slave delay line 108 generates a delayed input clock CLKD 109 based on the input clock CLK 102 and the calibration code received from the calibration module 106. The slave delay line 108, in one version, includes a plurality of delay elements coupled in series. Each delay element of the plurality of delay elements provides a predefined delay. The calibration code provides a number of delay elements that are configured to be activated in the slave delay line 108 based on the desired duty cycle.

The clock generation module 110 receives the delayed input clock CLKD 109. The clock generation module 110 generates an output clock CLKO 112, having the desired duty cycle, in response to the input clock CLK 102 and the delayed input clock CLKD 109. In one example, a positive edge of the output clock CLKO 112 is synchronized with a positive edge of the input clock CLK 102 and a negative edge of the output clock CLKO 112 is synchronized with a positive edge of the delayed input clock CLKD 109.

The DCC circuit 100 generates the output clock CLKO 112 having the desired duty cycle. The duty cycle of the output clock CLKO 112 is independent of a duty cycle of the input clock CLK 102, since the positive edge of the output clock CLKO 112 is synchronized with the positive edge of the input clock CLK 102 and the negative edge of the output clock CLKO 112 is synchronized with the positive edge of the delayed input clock CLKD 109. This allows the DCC circuit 100 to generate output clock CLKO 112 with a wide range of duty cycles.

The DCC circuit 100 includes digital elements which drastically reduce a locking time for duty cycle correction. In one example, the DCC circuit 100 requires 5 cycles to lock. The DCC circuit 100 is capable of tracking PTV (pressure, temperature and volume) variations and adjusts the duty cycle dynamically. In an example, when the input clock CLK 102 changes dynamically, the DCC circuit 100 provides duty cycle correction within a range of 1 to 10 clock cycles.

Figure 2:
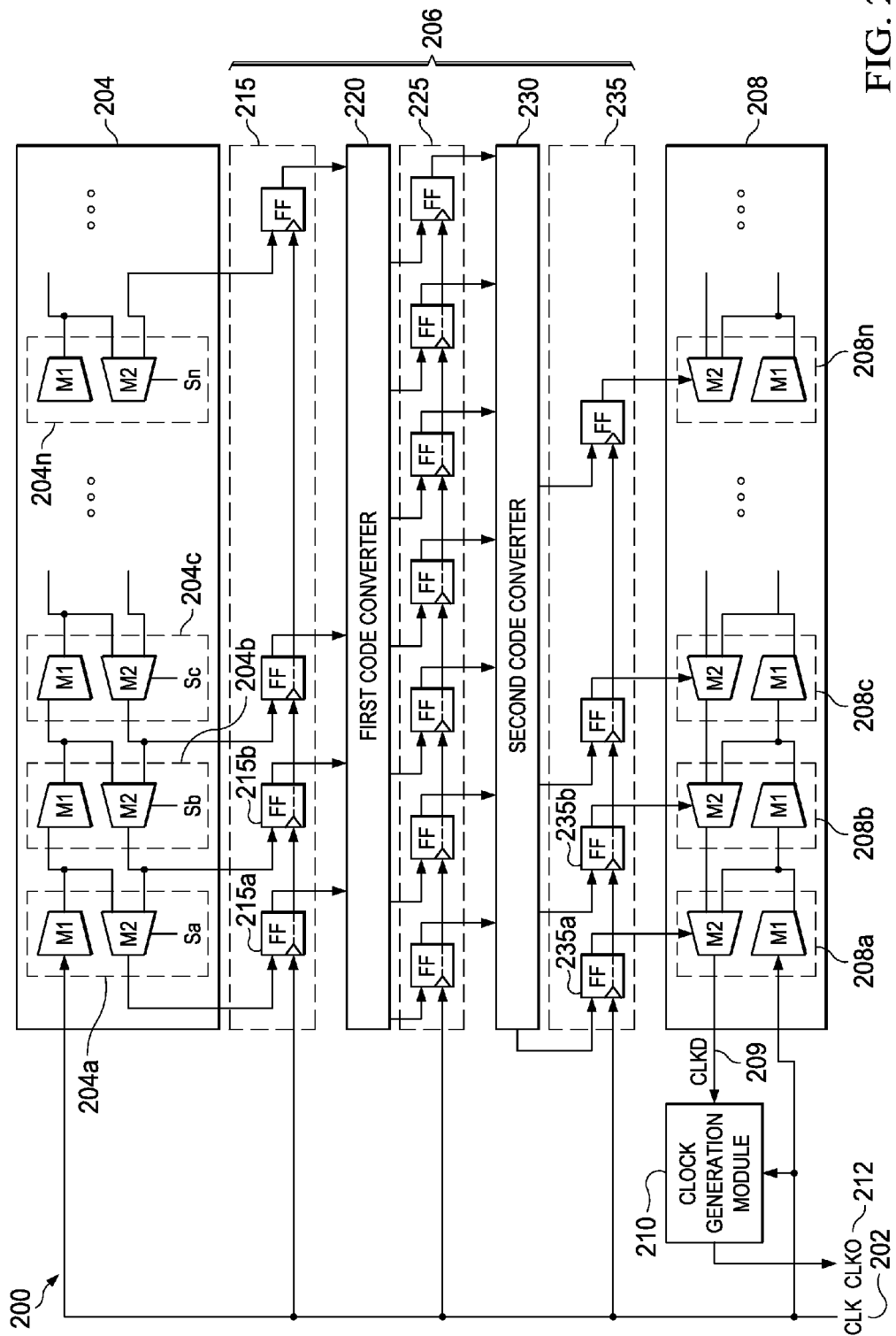
FIG. 2 illustrates a schematic of a duty cycle correction (DCC) circuit, according to an embodiment.

FIG. 2 illustrates a schematic of a duty cycle correction (DCC) circuit 200, according to an embodiment. The DCC circuit 200 includes a master delay line 204, a calibration module 206, a slave delay line 208 and a clock generation module 210. Each of the master delay line 204, the calibration module 206, the slave delay line 208 and the clock generation module 210 receives an input clock CLK 202. The calibration module 206 is coupled to the master delay line 204 and the slave delay line 208 is coupled to the calibration module 206. The clock generation module 210 is coupled to the slave delay line 208 and generates an output clock CLKO 212.

The master delay line 204 includes a plurality of delay elements illustrated as 204a, 204b, 204c and 204n. The plurality of delay elements 204a-204n are arranged in series. In one of the implementation each delay element of the plurality of delay elements 204a-204n includes a set of multiplexers. In another implementation, each delay element is at least one of the bi-polars, transistors and a combination of transistors.

The aim of the delay element is to provide a predefined delay. In the illustrated embodiment, each delay element includes a first multiplexer M1 and a second multiplexer M2. The second multiplexer M2 is each delay element receives a select line. For example, the second multiplexer M2 in the delay element 204a receives select line Sa and the second multiplexer M2 in the delay element 204n receives select line Sn. Each delay element provides the predefined delay.

The calibration module 206 includes a first set of flip-flops 215, a first code converter 220, a second set of flip-flops 225, a second code converter 230 and a third set of flip-flops 235. The first set of flip-flops 215 are coupled to the master delay line 204. The first code converter 220 is coupled to the first set of flip-flops 215 and the second set of flip-flops 225 are coupled to the first code converter 220. The second code converter 230 is coupled to the second set of flip-flops 225 and the third set of flip-flops 235 is coupled to the second code converter 230. The third set of flip-flops 235 is further coupled to the slave delay line 208. Each flip-flop is illustrated as FF and receives the input clock CLK 202.

The slave delay line 208 includes a plurality of delay elements illustrated as 208a, 208b, 208c and 208n. The plurality of delay elements 208a-208n are arranged in series. Each delay element of the plurality of delay elements 208a-208n includes a set of multiplexers. In an implementation, each delay element is at least one of the bi-polars, transistors and a combination of transistors. The aim of the delay element is to provide a predefined delay. In the illustrated embodiment, each delay element includes a first multiplexer M1 and a second multiplexer M2. Each delay element provides the predefined delay.

A clock generation module 210 is coupled to the slave delay line 208 and receives a delayed input clock CLKD 209 generated by the slave delay line 208. The clock generation module 210 generates an output clock CLKO 212. The DCC circuit 200 may include one or more additional components known to those skilled in the relevant art and are not discussed here for simplicity of the description.

The operation of the DCC circuit 200 illustrated in FIG. 2 is explained now. A first multiplexer M1 in the delay element 204a receives the input clock CLK 202. A first multiplexer M1 in the delay element 204b receives an output of the multiplexer M1 in the delay element 204a. The output of the multiplexer M1 in the delay element 204a is a delayed version of the input clock CLK 202.

Each multiplexer adds a fixed delay to the input clock CLK 202 and each delay element (the first multiplexer M1 and the second multiplexer M2 together) provides a predefined delay to the input clock CLK 202. In one example, the select lines Sa-Sn provided to the second multiplexer M2 in the delay elements 204a-204n are given static values such that a total delay provided by a delay element is more than one period of the input clock CLK 202 (across all PTV conditions). In another example, the select lines Sa to Sn are given values based on a frequency of operation of the DCC circuit 200.

A set of delay elements of the plurality of delay elements 204a-204n are activated based on a period of the input clock CLK 202. Thus, the master delay line 204 determines the period of the input clock CLK 202. The period of the input clock CLK 202 is a time difference between two consecutive positive edges in the input clock CLK 202. In one example, the period of the input clock CLK 202 is a time difference between two consecutive negative edges in the input clock CLK 202. In one example, the delay elements 204a and 204b are activated i.e. a delay provided by the multiplexers in the delay elements 204a and 204b is equivalent to the period of the input clock CLK 202. In the above example, the delay elements 204c-204n remain deactivated.

The first set of flip-flops 215 in the calibration module 206 receives an output of a second multiplexer M2 of each delay element of the plurality of delay elements 204a-204n. For example, a flip-flop (FF) 215a receives an output of a second multiplexer M2 in the delay element 204a and a flip-flop (FF) 215b receives an output of a second multiplexer M2 in the delay element 204b. Also, each flip-flop of the first set of flip-flops 215 receives the input clock CLK 202.

A number of flip-flops in the first set of flip-flops 215 that are activated is based on a set of delay elements that are activated in the master delay line 204 based on the period of the input clock CLK 202. Each flip-flop of the first set of flip-flops 215 provides an output to the first code converter 220. A combined output of the first set of flip-flops 215 represents a first code. In one example, the combined output of the first set of flip-flops 215 is a thermometric code.

The first code converter 220 converts the first code to a second code. In one version, the second code is a binary code. The binary code represents a number of delay elements required for achieving one period delay. Thus, in the above example, the first code converter 220 converts a thermometric code to a binary code. In another example, the second code is selected based on ease of multiplication and division. The first code converter 220 divides the second code based on a desired duty cycle to generate a divided code. A duty cycle required to be maintained for the output clock CLKO 212 is the desired duty cycle. The desired duty cycle is programmable. In one example, the desired duty cycle is 50%. In another example, the desired duty cycle is dynamic.

The first code converter 220, in one embodiment, performs scaling of the second code based on the desired duty cycle to generate a divided code. A number of flip-flops in the second set of flip-flops 225 are activated based on the divided code generated by the first code converter 220. The second code converter 230 converts the divided code to a calibration code. In one example, the calibration code is a thermometric code. In one version, the first code converter 220 converts a thermometric code to a binary code. The first code converter 220 divides the binary code to generate the divided code, and the second code converter 230 converts the divided code into a thermometric code.

A number of flip-flops in the third set of flip-flops 235 are activated based on the calibration code received from the second code converter 230. Each flip-flop of the third set of flip-flops 235 also receives the input clock CLK 202. Each flip-flop of the third set of flip-flops 235 provides an output to a delay element of the plurality of delay elements 208a-208n in the slave delay line 208. For example, a flip-flop 235a provides an output to a second multiplexer M2 in the delay element 208a and a flip-flop 235b provides an output to a second multiplexer M2 in the delay element 208b.

Thus, the calibration code provides a number of delay elements of the plurality of delay elements 208a-208n that are activated in the slave delay line 208 based on the desired duty cycle. A set of delay elements in the slave delay line 208 are activated based on the calibration code to generate a delayed input clock CLKD 209.

A first multiplexer M1 in the delay element 208a receives the input clock CLK 202. A first multiplexer M1 in the delay element 208b receives an output of the multiplexer M1 in the delay element 208a. The output of the multiplexer M1 in the delay element 208a is a delayed version of the input clock CLK 202. Each multiplexer adds a fixed delay to the input clock CLK 202 and each delay element (the first multiplexer M1 and the second multiplexer M2 together) provides a predefined delay to the input clock CLK 202.

Based on a number of delay elements activated in the slave delay line 208, the input clock CLK 202 suffers the delay in the delay elements to generate the delayed input clock CLKD 209. The delayed input clock CLKD 209 is provided to the clock generation module 210 that generates the output clock CLKO 212 having the desired duty cycle.

The DCC circuit 200 generates the output clock CLKO 212 having the desired duty cycle. The duty cycle of the output clock CLKO 212 is independent of a duty cycle of the input clock CLK 202. This allows the DCC circuit 200 to generate output clock CLKO 212 with a wide range of duty cycles.

The DCC circuit 200 includes digital elements (such as flip-flops, multiplexers) which drastically reduce a locking time for duty cycle correction. In one example, the DCC circuit 200 requires 5 cycles to lock. The DCC circuit 200 is capable of tracking PTV (process, temperature and voltage) variations and adjusts the duty cycle dynamically. In an example, when the input clock CLK 202 changes dynamically, the DCC circuit 200 provides duty cycle correction within a range of 1 to 10 clock cycles.

Figure 3:
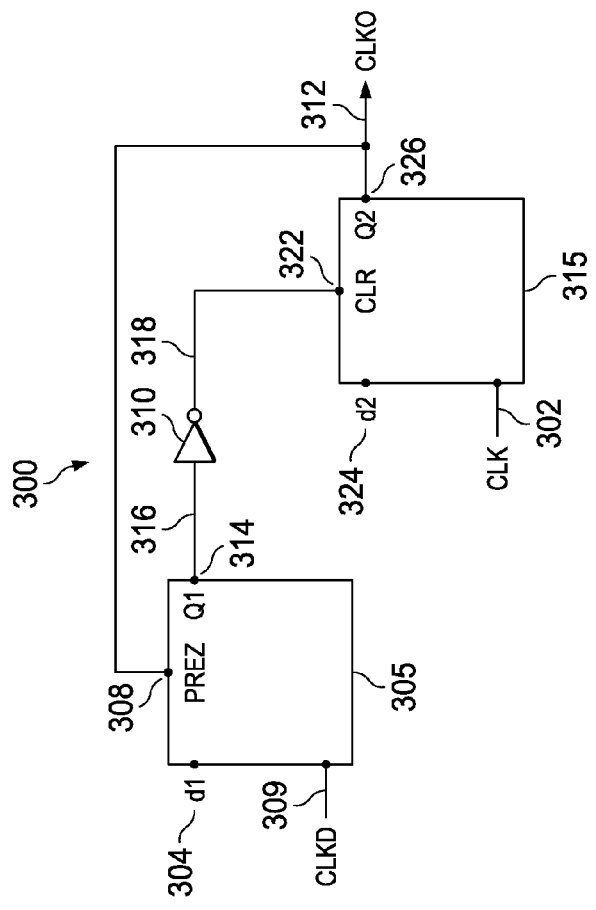
FIG. 3 illustrates a schematic of a clock generation module, according to an embodiment.

FIG. 3 illustrates a schematic of a clock generation module 300, according to an embodiment. In one example, the clock generation module 300 is analogous to the clock generation module 110 (illustrated in FIG. 1) in connection and operation. In another example, the clock generation module 300 is analogous to the clock generation module 210 (illustrated in FIG. 2) in connection and operation. The clock generation module 300 includes a first flip-flop 305, a first inverter 310 and a second flip-flop 315.

A first flip-flop 305 receives a delayed input clock CLKD 309. The delayed input clock CLKD 309 is generated from the calibration code as discussed in connection with FIG. 2 and FIG. 1. In one version, the delayed input clock CLKD 309 is similar to the delayed input clock CLKD 209. In another version, the delayed input clock CLKD 309 is similar to the delayed input clock CLKD 109. The first flip-flop 305 also receives a first flip-flop input d1 304 and an inverted preset signal on a PREZ node 308 of the first flip-flop 305.

An output node Q1 314 of the first flip-flop 305 is coupled to the first inverter 310. The first inverter 310 is further coupled to a clear node (CLR) 322 of the second flip-flop 315. The second flip-flop 315 receives an input clock CLK 302. The input clock CLK 302 is similar to the input clock CLK 202 and the input clock CLK 102. The second flip-flop 315 also receives a second flip-flop input d2 324. An output clock CLKO 312 is generated at an output node Q2 326 of the second flip-flop 315. The output clock CLKO 312 is provided to the first flip-flop 305 as the inverted preset signal at the PREZ node 308. The clock generation module 300 may include one or more additional components known to those skilled in the relevant art and are not discussed here for simplicity of the description.

The operation of the clock generation module 300 illustrated in FIG. 3 is explained now. The first flip-flop 305 receives the delayed input clock CLKD 309 and the first flip-flop input d1 304. In an example embodiment, the first flip-flop input d1 304 is at logic '0'. The first flip-flop 305 generates an inverted clear signal 316 at the output node Q1 of the first flip-flop 305. The first inverter 310 receives the inverted clear signal 316 and generates a clear signal 318. The second flip-flop 315 receives the input clock CLK 302 and the second flip-flop input d2 324. In another example embodiment, the second flip-flop input d2 324 is at logic '1'.

The second flip-flop also receives the clear signal 318 at the clear node (CLR) 322. The second flip-flop 315 generates the output clock CLKO 312, having a desired duty cycle, at the output node Q2 326 of the second flip-flop 315. In one example, the desired duty cycle is 50%. The second flip-flop 315 generates a positive edge of the output clock CLKO 312 on receiving a positive edge of the input clock CLK 302 such that the positive edge of the output clock CLKO 312 is synchronized with the positive edge of the input clock CLK 302.

Also, the second flip-flop 315 generates a negative edge of the output clock CLKO 312 on receiving a positive edge of the delayed input clock CLKD 309 such that the negative edge of the output clock CLKO 312 is synchronized with the positive edge of the delayed input clock CLKD 309.

Thus, a DCC circuit with the clock generation module 300 generates the output clock CLKO 312 having the desired duty cycle. The duty cycle of the output clock CLKO 312 is independent of a duty cycle of the input clock CLK 302, since the positive edge of the output clock CLKO 312 is synchronized with the positive edge of the input clock CLK 302 and the negative edge of the output clock CLKO 312 is synchronized with the positive edge of the delayed input clock CLKD 309. This allows the clock generation module 300 in the DCC circuit to generate output clock CLKO 312 with a wide range of duty cycles. The operation of the clock generation module 300 is further illustrated in connection with the timing diagrams illustrated in FIG. 4(*a*) and FIG. 4(*b*).

Figure 4A:
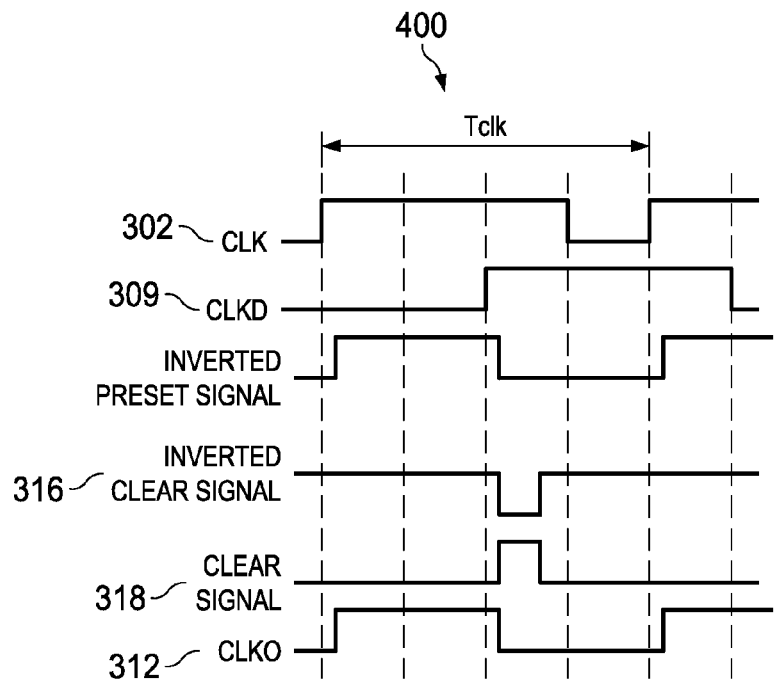
FIG. 4(a) is a timing diagram illustrating the input signals and the output signals of a clock generation module, according to an embodiment.
Figure 4B:
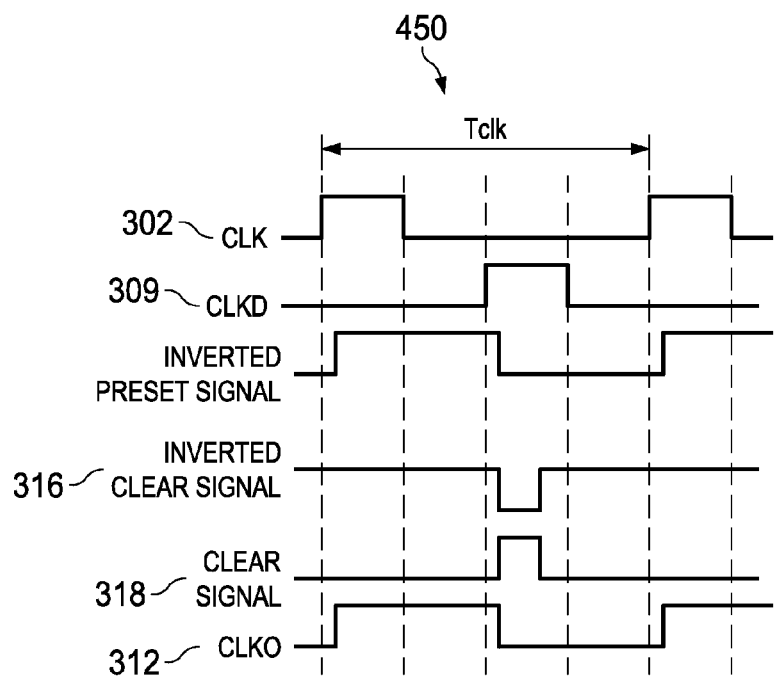
FIG. 4(b) is a timing diagram illustrating the input signals and the output signals of a clock generation module, according to an embodiment.

FIG. 4(*a*) is a timing diagram 400 illustrating the input signals and the output signals of a clock generation module, according to an embodiment. The timing diagram 400 illustrates the input signals and the output signals of the clock generation module 300 (illustrated in FIG. 3). As illustrated, the input clock CLK 302 has a duty cycle of more than 50% and $T_{clk}$ represents a period of the input clock CLK 302. The delayed input clock CLKD 309 is generated from the calibration code as discussed in connection with FIG. 2 and FIG. 1. For the ease of explanation, the desired duty cycle for the output clock CLKO 312 is 50% and the calibration code is accordingly determined.

The second flip-flop input d2 324 is at logic '1'. When the second flip-flop 315 receives a positive edge of the input clock CLK 302, an output clock CLKO 312 is generated at the output node Q2 326 of the second flip-flop 315. Thus, the positive edge of the output clock CLKO 312 is synchronized with the positive edge of the input clock CLK 302. The output clock CLKO 312 is also received as an inverted preset signal by the first flip-flop 305 at the PREZ node 308. The first flip-flop input d1 304 is at logic '0'.

When the first flip-flop 305 receives a positive edge of the delayed input clock CLKD 309, the inverted clear signal 316 transitions to logic '0'. As a result, the clear signal 318 transitions to logic '1'. When the clear signal 318 at logic '1' is received at the clear node (CLR) 322 of the second flip-flop 315, the output clock CLKO 312 transitions to logic '0'. When the output clock CLKO 312 is received as the inverted preset signal by the first flip-flop 305, the inverted clear signal 316 transitions to logic '1'. As a result, the clear signal 318 transitions to logic '0'.

Thus the negative edge of the output clock CLKO 312 is synchronized with the positive edge of the delayed input clock CLKD 309. The state of the second flip-flop 315 is maintained until a next positive edge of the input clock CLK 302 is received by the second flip-flop 315. Thus, the output clock CLKO 312 remains at logic '0' until the next positive edge of the input clock CLK 302. Thus, the output clock CLKO 312 has the desired duty cycle of 50%.

FIG. 4(*b*) is a timing diagram 450 illustrating the input signals and the output signals of a clock generation module, according to an embodiment. The timing diagram 450 illustrates the input signals and the output signals of the clock generation module 300 (illustrated in FIG. 3). As illustrated, the input clock CLK 302 has a duty cycle less than 50% and $T_{clk}$ represents a period of the input clock CLK 302. The delayed input clock CLKD 309 is generated from the calibration code as discussed in connection with FIG. 2 and FIG. 1. For the ease of explanation, the desired duty cycle for the output clock CLKO 312 is 50% and the calibration code is accordingly determined.

The second flip-flop input d2 324 is at logic '1'. When the second flip-flop 315 receives a positive edge of the input clock CLK 302, an output clock CLKO 312 is generated at the output node Q2 326 of the second flip-flop 315. Thus, the positive edge of the output clock CLKO 312 is synchronized with the positive edge of the input clock CLK 302. The output clock CLKO 312 is also received as an inverted preset signal by the first flip-flop 305 at the PREZ node 308. The first flip-flop input d1 304 is at logic '0'.

When the first flip-flop 305 receives a positive edge of the delayed input clock CLKD 309, the inverted clear signal 316 transitions to logic '0'. As a result, the clear signal 318 transitions to logic '1'. When the clear signal 318 at logic '1' is received at the clear node (CLR) 322 of the second flip-flop 315, the output clock CLKO 312 transitions to logic '0'. When the output clock CLKO 312 is received as an inverted preset signal by the first flip-flop 305, the inverted clear signal 316 transitions to logic '1'. As a result, the clear signal 318 transitions to logic '0'.

Thus the negative edge of the output clock CLKO 312 is synchronized with the positive edge of the delayed input clock CLKD 309. The state of the second flip-flop 315 is maintained until a next positive edge of the input clock CLK 302 is received by the second flip-flop 315. Thus, the output clock CLKO 312 remains at logic '0' until the next positive edge of the input clock CLK 302. Thus, the output clock CLKO 312 has the desired duty cycle of 50%.

Figure 5:
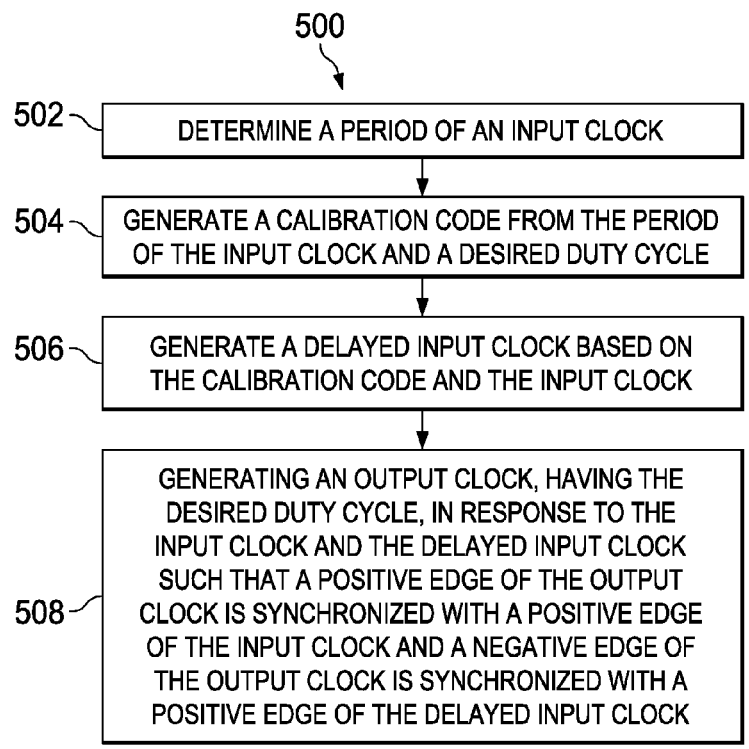
FIG. 5 is a flowchart illustrating a method of duty cycle correction, according to an embodiment.

FIG. 5 is a flowchart 500 illustrating a method of duty cycle correction, according to an embodiment. At step 502, a period of the input clock is determined. The period of the input clock is a time difference between two consecutive positive edges in the input clock. In one example, the period of the input clock is a time difference between two consecutive negative edges in the input clock.

At step 504, a calibration code is generated from the period of the input clock and a desired duty cycle. A duty cycle required to be maintained for an output clock is the desired duty cycle. The desired duty cycle is programmable. In one example, the desired duty cycle is 50%. In another example, the desired duty cycle is dynamic. At step 506, a delayed input clock is generated based on the calibration code and the input clock. The delayed input clock is generated from the calibration code as discussed in connection with FIG. 2 and FIG. 1.

At step 508, an output clock is generated, having the desired duty cycle, in response to the input clock and the delayed input clock. A positive edge of the output clock is synchronized with a positive edge of the input clock and a negative edge of the output clock is synchronized with a positive edge of the delayed input clock.

Figure 6:
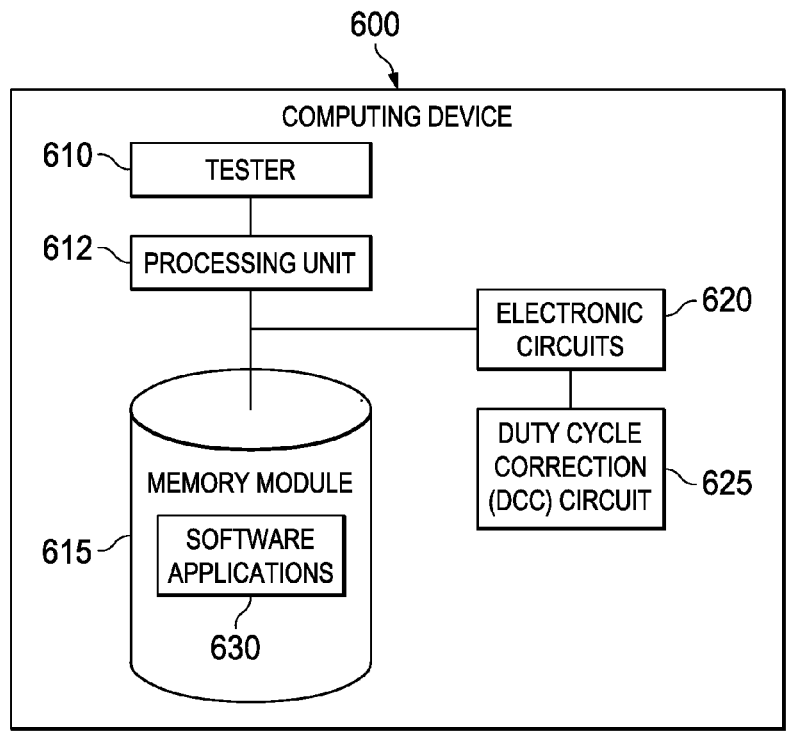
FIG. 6 illustrates a computing device, according to an embodiment.

FIG. 6 illustrates a computing device 600, according to an embodiment. The computing device 600 is, or is incorporated into, a mobile communication device, such as a mobile phone, a personal digital assistant, a transceiver, a personal computer, or any other type of electronic system. The computing device 600 may include one or more additional components known to those skilled in the relevant art and are not discussed here for simplicity of the description.

In some embodiments, the computing device 600 comprises a megacell or a system-on-chip (SoC) which includes a processing unit 612 such as a CPU (Central Processing Unit), a memory module 615 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP). The memory module 615 (which can be memory such as RAM, flash memory, or disk storage) stores one or more software applications 630 (e.g., embedded applications) that, when executed by the processing unit 612, performs any suitable function associated with the computing device 600.

The tester 610 comprises logic that supports testing and debugging of the computing device 600 executing the software applications 630. For example, the tester 610 can be used to emulate a defective or unavailable component(s) of the computing device 600 to allow verification of how the component(s), were it actually present on the computing device 600, would perform in various situations (e.g., how the component(s) would interact with the software applications 630). In this way, the software applications 630 can be debugged in an environment which resembles post-production operation.

The processing unit 612 typically comprises memory and logic which store information frequently accessed from the memory module 615. A plurality of electronic circuits 620 are coupled to the processing unit 612 and the memory module 615. In one example, the plurality of electronic circuits 620 is memories such as RAM, flash memory or disk storage. In another example, the plurality of electronic circuits 620 is hard IP clock inputs such as DDR PHY, SERDES, PLL, USB PHY. In yet another example, an electronic circuit of the plurality of electronic circuits 620 is a device configured to receive a reference clock. A duty cycle correction (DCC) circuit 625 is coupled to at least one of the plurality of electronic circuits 620. The DCC circuit 625 is analogous to at least one of the DCC circuit 100 and the DCC circuit 200 in connection and operation.

The DCC circuit 625 generates an output clock having the desired duty cycle. The duty cycle of the output clock is independent of a duty cycle of the input clock. This allows the DCC circuit 625 to generate output clock with a wide range of duty cycles. The DCC circuit 625 includes digital elements which drastically reduce a locking time for duty cycle correction. In one example, the DCC circuit 625 requires 5 cycles to lock. The DCC circuit 625 is capable of tracking PTV (pressure, temperature and volume) variations and adjusts the duty cycle dynamically. In an example, when the input clock changes dynamically, the DCC circuit 625 provides duty cycle correction within a range of 1 to 10 clock cycles.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections.

Further, the term "high" is generally intended to describe a signal that is at logic "1," and the term "low" is generally intended to describe a signal that is at logic "0." The term "on" applied to a transistor or group of transistors is generally intended to describe gate biasing to enable current flow through the transistor or transistors. Also, the terms "inactivation" or "inactivated" or turn "OFF" or turned "OFF" is used to describe a deactivation of a device, a component or a signal. The terms "activation" or "activated" or turned "ON" describes activation of a device, a component or a signal.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A duty cycle correction (DCC) circuit comprising:
   a master delay line configured to receive an input clock and configured to determine a period of the input clock;
   a calibration module coupled to the master delay line and configured to generate a calibration code based on a desired duty cycle and the period of the input clock;
   a slave delay line configured to generate a delayed input clock based on the input clock and the calibration code; and
   a clock generation module configured to generate an output clock, having the desired duty cycle, in response to the input clock and the delayed input clock, wherein the clock generation module comprises:
      a first flip-flop configured to receive the delayed input clock, an inverted preset signal and a first flip-flop input, and configured to generate an inverted clear signal;
      a first inverter configured to receive the inverted clear signal and configured to generate a clear signal; and
      a second flip-flop configured to receive the input clock, the clear signal and a second flip-flop input, wherein the second flip-flop is configured to generate an output clock having the desired duty cycle.

2. The DCC circuit of claim 1, wherein the period of the input clock is a time difference between two consecutive positive edges in the input clock.

3. The DCC circuit of claim 1, wherein each of the master delay line and the slave delay line comprises a plurality of delay elements coupled in series.

4. The DCC circuit of claim 3, wherein a delay element of the plurality of delay element comprises a set of multiplexers and each delay element of the plurality of delay elements provide a predefined delay.

5. The DCC circuit of claim 1, wherein a set of delay elements in the master delay line are configured to be activated based on the period of the input clock.

6. The DCC circuit of claim 1, wherein the calibration code provides a number of delay elements that are configured to be activated in the slave delay line based on the desired duty cycle.

7. The DCC circuit of claim 1, wherein a set of delay elements in the slave delay line are configured to be activated based on the calibration code to generate the delayed input clock.

8. The DCC circuit of claim 1, wherein the desired duty cycle is programmable.

9. The DCC circuit of claim 1, wherein the first flip-flop input is at logic '0' and the second flip-flop input is at logic '1'.

10. The DCC circuit of claim 1, wherein the output clock is the inverted preset signal received by the first flip-flop.

11. The DCC circuit of claim 1, wherein the second flip-flop is configured to generate a positive edge of the output clock on receiving a positive edge of the input clock such that the positive edge of the output clock is synchronized with the positive edge of the input clock.

12. The DCC circuit of claim 1, wherein the second flip-flop is configured to generate a negative edge of the output clock on receiving a positive edge of the delayed input clock such that the negative edge of the output clock is synchronized with the positive edge of the delayed input clock.

13. A method of duty cycle correction comprising:
   determining a period of an input clock;
   generating a calibration code from the period of the input clock and a desired duty cycle;
   generating a delayed input clock based on the calibration code and the input clock;
   generating an output clock, having the desired duty cycle, in response to the input clock and the delayed input clock, wherein a positive edge of the output clock is synchronized with a positive edge of the input clock and a negative edge of the output clock is synchronized with a positive edge of the delayed input clock;
   generating an inverted clear signal in a first flip-flop based on the delayed input clock, an inverted preset signal and a first flip-flop input;
   generating a clear signal from the inverted clear signal; and
   generating the output clock based on the input clock, the clear signal and a second flip-flop input, wherein the output clock is the inverted preset signal received by the first flip-flop.

14. The method of claim 13, wherein the desired duty cycle is programmable.

15. The method of claim 13, wherein the period of the input clock is a time difference between two consecutive positive edges in the input clock.

16. The method of claim 13, wherein generating the delayed input clock further comprises:
   activating a set of delay elements in a master delay line based on the period of the input clock;

determining a number of delay elements that are configured to be activated in a slave delay line based on the desired duty cycle;

activating a set of delay elements in the slave delay line based on the calibration code and the input clock.

17. The method of claim 13, wherein the first flip-flop input is at logic '0' and the second flip-flop input is at logic '1'.

18. A computing device comprising:

a processing unit;

a memory module coupled to the processing unit;

a plurality of electronic circuits coupled to the processing unit and the memory module, a duty cycle correction circuit (DCC) coupled to at least one of the plurality of electronic circuits, the duty cycle correction circuit comprising:

a master delay line configured to receive an input clock and configured to determine a period of the input clock;

a calibration module coupled to the master delay line and configured to generate a calibration code based on a desired duty cycle and the period of the input clock;

a slave delay line configured to generate a delayed input clock based on the input clock and the calibration code; and a clock generation module configured to generate an output clock, having the desired duty cycle, in response to the input clock and the delayed input clock, wherein the clock generation module comprises:

a first flip-flop configured to receive the delayed input clock, an inverted preset signal and a first flip-flop input, and configured to generate an inverted clear signal;

a first inverter configured to receive the inverted clear signal and configured to generate a clear signal; and a second flip-flop configured to receive the input clock, the clear signal and a second flip-flop input, wherein the second flip-flop is configured to generate an output clock having the desired duty cycle.

* * * * *